United States Patent
Gerhaeuser et al.

(10) Patent No.: US 7,457,596 B1
(45) Date of Patent: Nov. 25, 2008

(54) METHOD AND APPARATUS FOR DETERMINING THE RECEPTIVITY OF RADIO SIGNALS

(75) Inventors: Heinz Gerhaeuser, Waischenfeld (DE);
Georg Plenge, Egling-Thanning (DE);
Dieter Seitzer, Erlangen (DE); Robert Sedlmeyer, Ismaning (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 0 days.

(21) Appl. No.: 08/676,355

(22) PCT Filed: Jan. 16, 1995

(86) PCT No.: PCT/DE95/00055
§ 371 (c)(1),
(2), (4) Date: Sep. 17, 1998

(87) PCT Pub. No.: WO95/20276
PCT Pub. Date: Jul. 27, 1995

(30) Foreign Application Priority Data
Jan. 19, 1994 (DE) .................... 44 01 460

(51) Int. Cl.
*H04B 1/18* (2006.01)
(52) U.S. Cl. .................. 455/156.1
(58) Field of Classification Search ........ 455/412, 455/414, 456, 457, 422, 517, 186.1, 156.1, 455/185.1, 188.1, 184.1, 161.1, 154.1, 166.1, 455/157.1

See application file for complete search history.

(56) References Cited

U.S. PATENT DOCUMENTS

| | | | | |
|---|---|---|---|---|
| 5,086,511 A * | 2/1992 | Kobayashi et al. | ........ | 455/156 |
| 5,134,719 A | 7/1992 | Mankovitz | ........ | 455/154.1 |
| 5,278,988 A * | 1/1994 | Dejean et al. | ........ | 455/2 |
| 5,307,513 A * | 4/1994 | Harada | ........ | 455/186.1 |
| 5,819,166 A * | 10/1998 | Kimura et al. | ........ | 455/186.1 |

FOREIGN PATENT DOCUMENTS

| | | |
|---|---|---|
| DE | 30 40 465 | 6/1982 |
| DE | 38 10 179 | 10/1989 |
| DE | 41 07 116 | 9/1992 |
| EP | 0387810 | 9/1990 |
| JP | 58-040915 | 3/1983 |
| JP | 58-195582 | 12/1983 |
| JP | 63-062407 | 3/1988 |
| JP | 64-068028 | 3/1989 |
| JP | 01-130633 | 5/1989 |
| JP | 01-223828 | 9/1989 |

(Continued)

OTHER PUBLICATIONS

Japanese Office Action in JP Application Hei-7-519,219 which parallels DE 3810179.

*Primary Examiner*—Naghmeh Mehrpour
(74) *Attorney, Agent, or Firm*—Michael A. Glenn; Glenn Patent Group

(57) ABSTRACT

A method and apparatus for determining the receptivity of radio signals at any given receiving site in an area covered by at least one transmitter by comparing data stored and continuously updated in a receiver against data transmitted, and identifying and selecting from all the transmitted radio signals a preferred radio signal.

34 Claims, 3 Drawing Sheets

FOREIGN PATENT DOCUMENTS

| | | |
|---|---|---|
| JP | 01-276829 | 11/1989 |
| JP | 01-277029 | 11/1989 |
| JP | 02-238723 | 9/1990 |
| JP | 61-81460 | 6/1994 |
| JP | 61-94437 | 7/1994 |

* cited by examiner

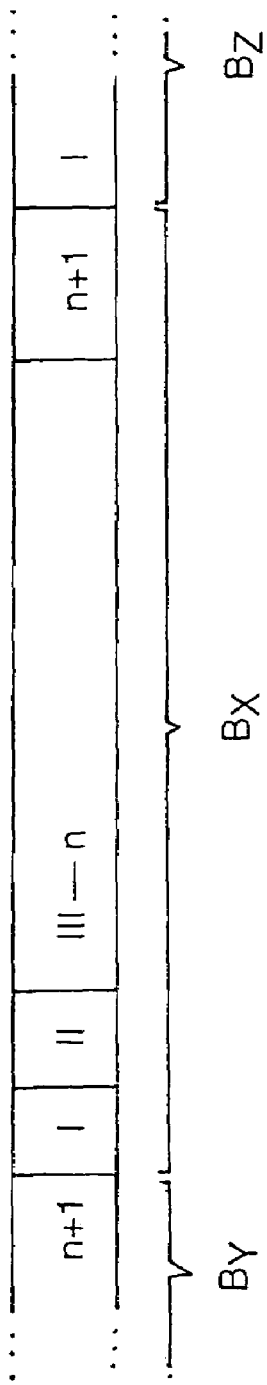

METHOD AND APPARATUS FOR DETERMINING THE RECEPTIVITY OF RADIO SIGNALS

BACKGROUND OF THE INVENTION

1. Field of the Invention

The invention relates to a method of determining the receptivity of wireless signals in a broadcast system and to a receiver for performing the operations necessary for the reception.

The invention may be especially practiced in a broadcast system, and, more particularly, in a common frequency system, with the wireless signals embracing, for example, the transmitting stations, program signals and/or program varieties which can be received. For when receiving radio transmitting stations with mobile receivers, for instance in an automotive vehicle, it is desirable to determine the programs which can be received at any given receiving location. Such programs may include, for instance, traffic reports or information relating to a traffic conduction system.

2. The Prior Art

Present day analog frequency modulated (FM) transmission methods react sensitively to variations in field strength and to multi-path reception the effects of which may only partially be reduced, for instance, by elaborate change-over strategies to so-called alternative frequencies which are transmitted as components of the radio data signals (RDS). Defining a station by means of a mobile receiver has hitherto required elaborate measures. Thus, complex circuit arrangements are required, often even including two receiving sections, reference transmitters and/or lists of alternative frequencies stored in the receiver. The latter is required for switching, wherever possible without delay and inaudibly, to alternative frequencies in case a program tuned in on a mother station can either not be received at all or poorly only. To obtain, depending upon the actual receiving location, data about receivable programs is possible to a limited extend only with existing systems, such as, for example, the aforementioned RDS. Moreover, the scanning operations for finding receivable transmitters and their identification require a relatively long time.

A method utilizing the radio data signals of at least three stationary transmitters for passive evaluation to define a location with a mobile wireless receiver is known from German patent specification 4,107,116. The publication states that the method offers the possibility of linking the defined position coordinates of the mobile wireless receiver with route-specific and/or geographic identification signals of traffic reports transmitted via the RDS signal over the traffic message channel. In this manner, only those reports which are significant to the instantaneous location are selected from the transmitted reports; all others are faded out. The disadvantage of such a system is that the operator has to preselect the given program variety, such as, in the present example, the traffic report, so that prior to his selection he does not know whether he will receive anything at all, or what it will be. Hence, it will take some time after one or more searching operations until the operator will actually receive the desired information.

To achieve a qualitatively excellent wireless audio transmission corresponding to the quality standard offered by digital storage media (for example DAT), a standard was developed for a terrestrial digital transmission method, known as DAB (digital audio broadcasting). One of the essential characteristics of the DAB method is the common frequency operation of the transmitters employed for a receiving area, with all of the transmitters being connected in a frequency and phase locked relationship and the modulation contents of the individual carriers being identical for all transmitters. From German Patent Specification 4,223,194 it is known that a receiver suitable for DAB may simultaneously be utilized for defining a location, so that no additional receivers are required. Additional transmitters are also not required.

Moreover, German Patent Specification 4,222,877 describes how regionally or locally different data may be transmitted in a DAB network with technical means, without interfering with the common frequency transmission of locally identical data. The transmission of regionally different data is specifically carried out by additional transmission from the transmission station of individual carrier frequencies which are preferably transmitted in a time slot of a transmission window which is also utilized for synchronizing the receiver. The receiver, for performing receiving operations, is provided with a memory and an indicator, additional data being stored in the memory by means of a data record associated with each transmission station. They may either be displayed on the indicator, or they should enable the operator of the receiver to improve the quality of the reception, for instance, by changing the receiving parameters. The specification only discloses how regionally limited data can be transmitted with technical means within a DAB network.

OBJECT OF THE INVENTION

Proceeding from the state of the art described supra, it is an object of the invention to provide a method of, and a receiver for, determining the receptivity of wireless signals in a broadcast system such that any wireless signal desired by an operator may be quickly and reliably tuned in on his receiver or receiving device at any given location within a receiving area.

SUMMARY OF THE INVENTION

The task is accomplished by a method of determining and receiving radio signals and data relating to radio signals receivable at an actual receiving site within a receiving area covered by at least one transmitter by utilizing at least one first list containing different data blocks relating to different radio signals in principle receivable in the receiving area and associated with a unique program identifier for determining data relating to radio signals receivable in the receiving area, and, based upon the data relating to the receiving site, utilizing a second list for selecting every radio signal receivable in the receiving site and containing, for a given partial receiving area, including the receiving site, the unique program identifiers associated with the data blocks relating to radio signals receivable at the partial receiving area, and on the basis of the data blocks of the first list and associated with the unique program identifiers in the second list, providing one radio signal from all the radio signals actually receivable at the receiving site.

Other objects will in part be obvious and will in part appear hereinafter.

The invention provides for a method and for a receiver for carrying out this method, by means of which data regarding receivable wireless signals may be determined, and presented for selection by an operator, at any location within a receiving area served by one or more transmitters of a broadcasting system.

The wireless signal thereafter selected by the operator is turned in directly on his receiver and is thus available for further uses at the actual receiving location, for instance for actualizing and/or supplementing data stored in the receiver proper or in a data carrier (for instance a chip card) which either is connected with the receiver or has to be connected with the receiver for data actualization. In one embodiment of the invention as applied to a broadcast system, the further utilization of the selected wireless signal such as, for example, a program, consists primarily of making the program tuned into the receiver audible to the operator through loudspeakers. Another kind of use resides in the presentation of visual information, such as maps, on a video monitor.

The invention is especially useful for determining the receptivity of transmitters, program signals and/or of program varieties and, where appropriate, other wireless signals in a broadcast system. Preferably, the transmitters will be operating in a common frequency mode, and they may be stationed on earth or extra-terrestrially, as on satellites, for instance. Aside from audio programs, the program signals may selectively include data programs also. Program variety connotes kinds of programs such as popular music, sports or classical music which depend upon a particular broadcast station or chain of broadcast stations by which they are transmitted. Methods known, for instance, from radio technology or satellite navigation systems are utilized for exact or approximate determinations of the receiving location. A method of defining a location suitable for a DAB broadcast system which uses a phase comparison hyperbola method, has been described in German Patent Specification 4,223, 194.

It is of advantage to determine especially the reliably receivable transmitters, program signals and/or program varieties at a given location within a the receiving area. They are readily determinable owing to the transmitting power of the individual transmitters and their locations, whereas the overrange reception, for instance, may uncontrollably change because of different weather conditions or because of sun spot activity.

Broadcast stations are located, and their transmitting power is determined, such that the receiving area is preferably divided into several partial areas so that the same reliably receivable transmitters, program signals and/or program varieties may be received at any location within each of those partial areas. Thus, for each partial area a single list of data relating to the reliably receivable transmitters, program signals and/or program varieties will suffice. These local lists, hereinafter sometimes referred to as "B-lists", are transmitted by the stations, preferably by arranging all local B-lists in succession. The B-list sequence thus created is broadcast by all stations. In a special embodiment of the invention, the B-lists are stored in the receiver, and the stations transmit only data concerning changes to be made in the B-lists stored in the receiver. Such changes may relate to program changes at relatively short notice. Except for transmission errors in the transmitted actualizing data for the B-lists, the storage of the B-lists will be error free, thus resulting in a considerably greater reliability for the operator In addition to the B-lists, an A-list will be used which contains the identification signals of all transmitters, program signals and/or program varieties which may in principle be received in a receiving area. This A-list is transmitted by the stations. In a further embodiment of the invention, the A-list is stored in the receiver, preferably in an external mass storage or bulk memory. "In principle be received" means in particular that the A-list is set up with free spaces for stations which are existing but which are not transmitting or for stations which are in the planning stage only. If a new transmitter is added to the transmission network, or if an old transmitter is deactivated, the A-list will be actualized correspondingly. Hence, in the previously mentioned embodiment of an A-list stored in a receiver only these changes need be transmitted. In the A-list, changes will occur rather infrequently, whereas in the B-lists program changes of short notice will be reflected.

The B-list valid for a given receiving location will be selected from the B-lists, and more particularly from the B-list sequence, on the basis of the defined location coordinates of the receiving location or on the basis of location data relating to the associated partial area. On the basis of the local B-list, the appurtenant identification signals of the transmitter, program signals and/or program varieties are selected from the A-list and are made available for the user's selection by a visual or voice signal. The user is thus apprized of the transmitters, program signals and/or program varieties receivable at his actual receiving location, and may, if he wishes, select a particular transmitter and/or a particular program and/or a particular kind of program. Following selection by the user, the desired item is directly tuned into his receiver.

In a broadcasting system, such as the DAB system, in which several frequency blocks of a predetermined bandwidth are frequency transmitted in a side-by-side manner, and in which a receiver is probably capable of receiving only one such frequency block at any given time, care must be taken that such receiver does not only recognize the program contents of its frequency block but also the program contents of other, adjacent frequency blocks. This is accomplished in the local B-lists by the use of data relating to receivable transmitters, program signals and/or program varieties which may also be received in other frequency ranges, channels or frequency blocks. This ensures that the user is given an indication of the transmitters, program signals and/or program varieties receivable for his selection at his receiving location. It is of particular advantage that it is not necessary to detune the receiver and that an indication of receivable transmitters, program signals and/or program varieties is given at a shorter time. Conversely, more programs may be offered in the user at the same indication interval.

In a particular embodiment of the invention, it is not only the B-list valid at a given receiving location which is selected at this actual location and is stored in the receiver, but also the B-lists for the adjoining partial areas. Upon changing the receiving location, the same situation is created on the basis of the stored B-lists of the immediately adjoining partial areas. The B-lists of those partial areas which are no longer adjoining the new receiving location are erased from the memory, and the B-lists of the newly added partial areas are added to the memory. Storing of the B-lists of adjoining partial areas is advantageous since by utilizing the directional data of the changing receiving location the data relating to receivable transmitters, program signals and/or program varieties may quickly and reliably be put at the disposal of the user, for his selection, when changing into an adjoining partial area. The user will either generally, or upon request, be given an indication whether a currently received program can or cannot still be received after changing to an adjoining partial area. He may then make a new selection or he may arrange, by means of the priority selection of a program variety at least to receive a program of the kind selected by him.

Where the receiving area is divided into partial areas in a pattern approximating a chessboard, there will be eight adjoining areas for each partial area. Hence, when the receiving location diagonally in the square of a partial area, five B-lists will always have to be erased as well as added. When changing the receiving location in a direction parallel to the limits of the partial areas, only three B-lists times two need be changed which can, however, be accomplished quickly.

B-lists preferably made up of sequences of (program/variety) numbers, each one represented by a 16-bit-address, are of further advantage, for they can quickly be read into a receiver, and because of their low memory space requirements they permit the use of random access memories (RAM's) for storing local B-lists and/or B-lists of adjoining partial areas.

By the use of local B-lists and their linking to the A-list, the invention provides for utilizing advance information and for thereby more quickly indicating for a user's choice the transmitters, program signals and/or program varieties which can be received and, furthermore, for assuring him or a high degree of certainty as to the reception of a selected program or program variety. This is evident from the fact that the memory requirements for several B-lists stay within limits so that not only the actual B-list but also the B-lists of the adjoining partial areas may be stored in commercially available memory components.

DESCRIPTION OF THE SEVERAL DRAWINGS

The novel features which are considered to be characteristic of the invention have been set forth with particularity in the appended claims. The invention itself, however, in respect of its structure, construction and lay-out as well as manufacturing techniques, together with other objects and advantages thereof, will be best understood from the following description of preferred embodiments when read in connection with the appended drawings, in which:

FIG. 2 are excerpts of an A-list and of a sequence of B-lists with correlated numbers;

FIG. 3 is a formalization of a B-list;

Figure 4:
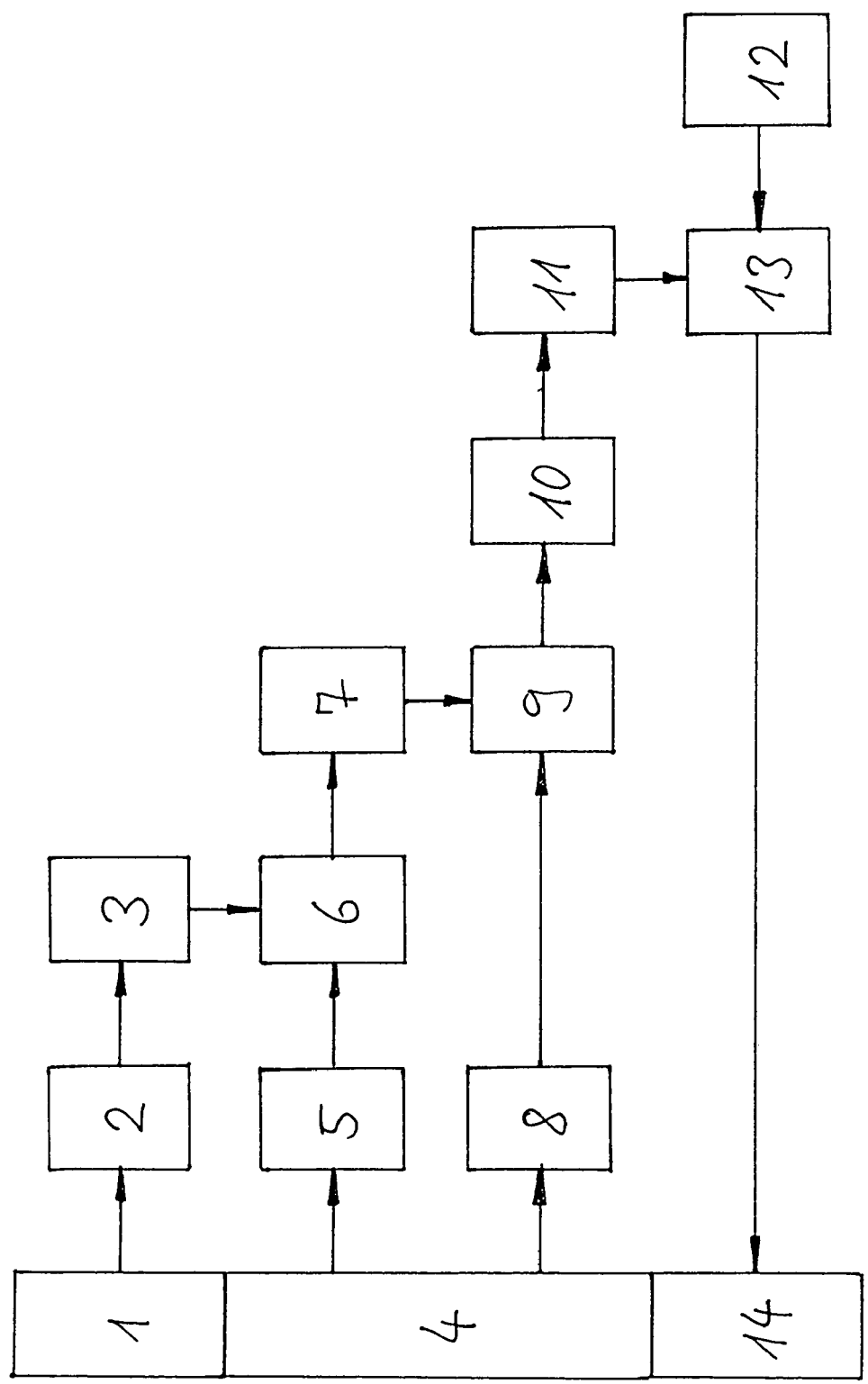

FIG. 4 schematically depicts a receiver.

DETAILED DESCRIPTION OF THE PREFERRED EMBODIMENT

Figure 1:
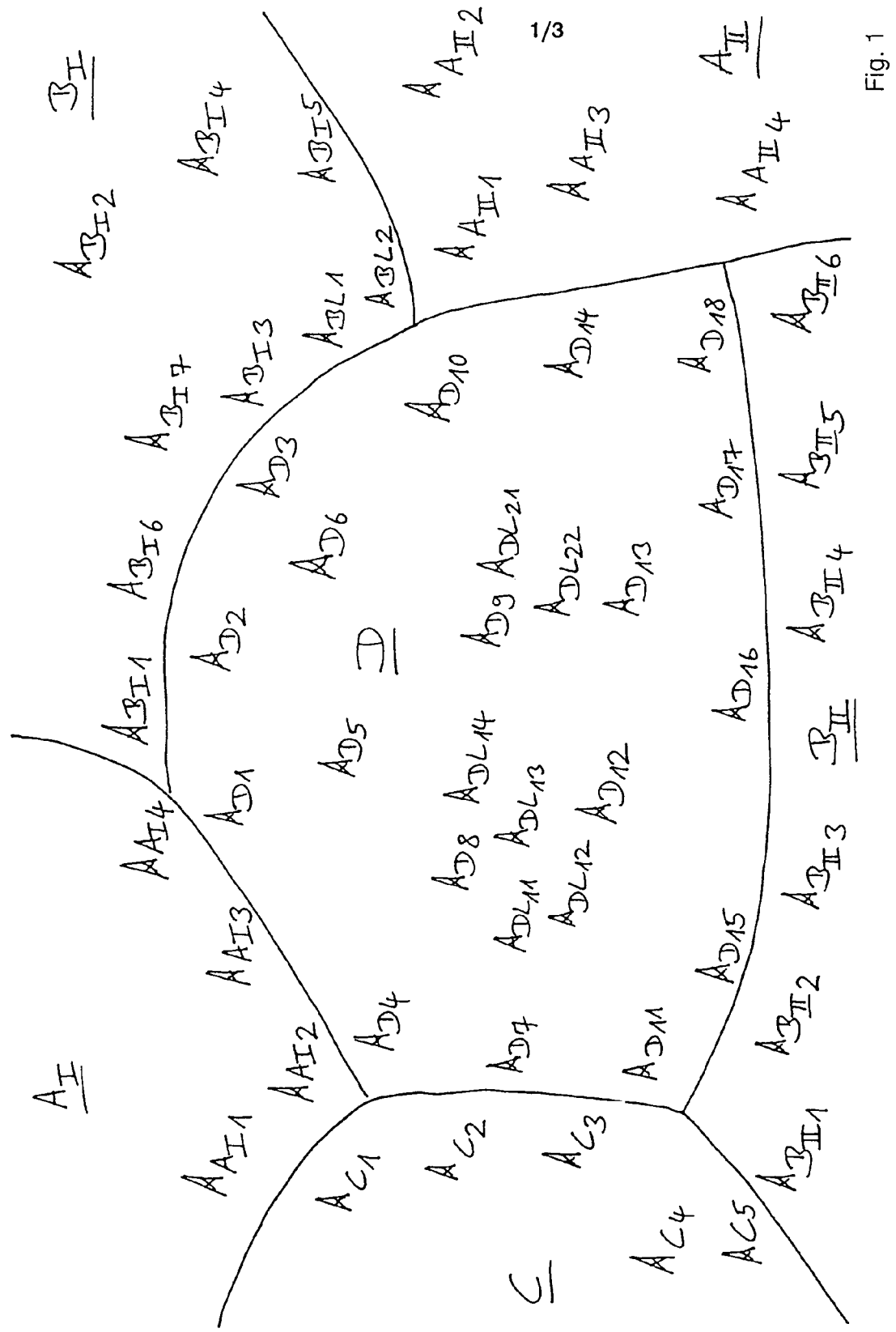
FIG. 1 is an excerpt of a map.

FIG. 1 depicts an excerpt of a map into which the borders of a broadcast area D have been entered in their entirety, and the borders of adjoining broadcast areas $A_I$, $B_I$, $C_I$, $A_{II}$, and BII have been partially entered. Individual transmitters have been shown in FIG. 1 by subscript numbers on the right next to the symbol of the broadcast area. For differentiation, local and regional transmitters have been identified by index L. The entire surface of each of the broadcast areas is served by one or more common frequency networks. The areas $A_I$ and $B_I$ as well as $B_I$ and $B_{II}$ are spatially sufficiently divided to allow identical transmission frequencies to be allotted to areas $A_I$ and $A_{II}$ as well as $B_I$ and $B_{II}$, without any possibility of mutual interferences. At low transmitting power, the frequencies defined for local and regional transmitters in one broadcasting area preferably coincide with the frequencies of the adjoining areas; where the transmitting powers are too great, different frequencies will be used in adjoining areas.

The data transmitted as an A-list in the common frequency network of broadcast area D contain program data PI and program variety PS, similar to an RDS system, of all transmitters which can be received. This list also contains the program identification signals of those programs which are transmitted from adjoining areas at the borders of a broadcast area and which can be received, as well as the identification signals of all receivable local and regional transmitters. Furthermore, data relating to relievable transmitters, program signals and/or program varieties which are receivable in other frequency ranges, channels or frequency blocks are transmitted in the A-list. All identification signals of the A-list are identified by consecutive natural numbers (FIG. 2). In a common frequency network the program identification signals valid for the environment of individual transmitters are transmitted in individual lists which consist only of number sequences of the numbers of the A-list. FIG. 2 depicts the beginning of the A-list, starting with program varieties $PS_1$, $PS_2$, and so on, of station $D_1$ in broadcast area D. Following this are the program varsities of the local transmitters and the program identification signals of the remaining stations. Starting with program variety $PS_1$ of station $D_1$ natural numbers beginning with one are allotted in ascending order to the program identification signals. Below the excerpt of the A-list there is shown in FIG. 2 the beginning of the B-list sequence represented by symbols. At the beginning, there is shown the identification signal of a transmitter, in this case $D_1$ followed by the numbers of those program identification signals of the A list the programs of which can be received at locations in the vicinity of transmitter $D_1$. This is followed in the sequence of B-lists by an analogous enumeration for transmitter $D_2$ and so on.

As shwon in FIG. 3, a local B-list is made up of a defined number of bytes. After a start command in byte I, there follows in byte II the data for which transmitter X of the common frequency network the following list of numbers of program identification signals is valid. In bytes III through n the numbers of the program identification signals valid for transmitter X are listed in accordance with their correlation to the A-list. This is followed by the end of the identification signal of a B-list in byte n+1. By sequentially arranging such formatted B-lists there is created a B-list sequence of which FIG. 3 depicts only the end identification signal n+1 of B-list $B_Y$ of transmitter Y, the entire B-list $B_X$ of transmitter X and the first byte I of B-list $B_Z$ of transmitter Z.

By means of the transmitter location identification signal of the nearest transmitter of the common frequency network which is receivable at the receiving location the receiver initially selects the B-list which applies to the receiving location. On the basis of this B-list the program identification signals valid for the actual receiving location are selected from the A-list and kept in a memory for the emission of an indication.

Only the programs of the common frequency network D can be received at locations near transmitter $D_5$. The programs of transmission networks D, $A_I$ and $B_I$ can be received at a receiving location near transmitter $D_1$. The programs of the transmission network D as well as of the local transmitters $DL_{11}$, $DL_{12}$, $DL_{13}$ and $DL_{14}$ can be received at receiving locations near transmitter $D_8$. The programs of transmission networks D, $B_I$, $A_{II}$, as well as the programs of local transmitters $BL_1$ and $BL_2$ are receivable at a receiving station near transmitter $D_{10}$. The programs of the transmission networks D and $B_{II}$ can be received near transmitter $D_{16}$.

The operating mode of a receiver for practicing a first embodiment of the method in accordance with the invention will hereafter be described with reference to FIG. 4.

The receiver is provided with a first receiving component (1) for receiving und decoding the transmitter location identification signal. In stage (2) connected to receiving component (1) the identification signal of the transmitter location of the currently received transmitter is evaluated. This identification signal is fed to a memory (3) to be stored therein.

A further receiving component (4) of the receiver receives data by way of a B list and an A-list. In stage (5) which is connected to the receiving component (4), the data contained in the B-lists are specially selected. In the selection stage (6) the B-list valid for the actual receiving location is selected on the basis of the available transmitter location identified signal or location data and is stored in a further stage (7).

Those data received by the receiving component (4) which contain the program identification signals and their numbering (A-list) are selected in stage (8). The program identification signals valid for the receiving location are selected from the read-in A-list on the basis of the data relating to the B-list valid for the actual receiving location and contained in memory (7), and stored in memory (10). From this memory the program identification signals are fed to an indicator where they are available to be called up by a user or listener. The indicator may be a video display or a voice emitter.

The display on a monitor or the voice emission of the programs receivable at the receiving location is initiated by an input from the user in stage (12), as by pushing a key "call up". The receivable programs will then appear on the monitor in succession with a sufficient dwell time (for instance 3 seconds). Should the listener wish to change to one of the indicated programs, he may prompt the change in the receiver to a currently indicated program by pressing a "new selection" key. The program identification signal which appears in the indicator is transferred to a further stage (13). By pressing the key "new selection" the (selected) program identification signal is transferred to the receiver in a receiving component (14) which tunes in the corresponding program.

At a change in the program and/or a change of the transmitter location identification signal or of the receiving location the entire process described above is released again, and the contents of every memory are replaced.

In a second embodiment of a receiver for practicing the method in accordance with the invention selection of a predetermined program variety leads to an indication of only those programs in the display which fall under the selected variety.

In a further embodiment another generally known and available method of determining the actual location or receiving location, such as, for instance, a method satellite navigation or other traffic navigation systems, is used instead of the location identification signal of the received transmitter. The coordinates of the actual receiving location determined thereby are stored in memory (3) and are used for selecting the B-list applicable to the actual receiving location.

The invention claimed is:

1. A method of determining and providing radio signals and data relating to radio signals receivable at an actual receiving site, comprising the steps of:
   determining data relating to the actual receiving site in a radio system, wherein receiving sites in a given receiving area are covered by at least one transmitter;
   utilizing, for determining data about radio signals receivable at the actual receiving site, at least one first list containing different data blocks about different radio signals receivable in principle in the given receiving area, each different data block having associated therewith a unique program identifier;
   utilizing, based on the data relating to the actual receiving site, at least one second local list for the selection of all radio signals receivable at the actual receiving site, the at least one second list containing for a given partial area of the receiving area including the actual receiving site, the unique program identifiers associated with the different data blocks about the radio signals actually receivable in the partial area, the data blocks being included in the first list and not in the second list; and
   directly providing on the basis of the data blocks included in the first list and associated with the unique program identifiers included in the second list, a radio signal selected from all of the radio signals actually receivable at the aqctual receiving site.

2. The method of claim 1, in which the step of determining data relating to the actual receiving site comprises determining and utilizing local data derived from local coordinates of the actual receiving site.

3. The method of claim 1, in which the step of determining data relating to the actual receiving site comprises determining and utilizing local data by means of radio signals actually receivable at the receiving site.

4. The method of claim 1, wherein the data blocks of the first list, about the different radio signals in principle receivable within the receiving area covered by at least one transmitter are transmitted by the at least one transmitter.

5. The method of claim 4, further comprising the step of storing in a receiver the data blocks on the first list.

6. The method of claim 5, further comprising the step of exchanging only data stored in the receiver which is affected by changes of radio signals receivable within a receiving area covered by the at least one transmitter.

7. The method of claim 1, wherein the data in the at least one first list receivable as a function of the actual receiving site is transmitted by the at least one transmitter.

8. The method of claim 7, further comprising the step of storing in a receiver the data in the at least one first list receivable as a function of the actual receiving site.

9. The method of claim 8, further comprising the step of exchanging, when changing from a first receiving site to a new receiving site, only data relevant to the new receiving site which differs from data relating to the first receiving site.

10. The method of claim 1, further comprising the steps of actualizing the data relating to radio signals receivable at a receiving site covered by at least one transmitter in one transmission cycle and of repeatedly actualizing data relating to radio signals in the at least one first list and receivable as a function of the actual receiving site.

11. The method of claim 1, wherein a plurality of second local lists containing for different given partial areas of the receiving area the signals associated with the radio signals receivable at the partial areas are compiled to a single list.

12. The method of claim 1, further comprising the steps of determining, from a plurality of second local lists, the second local list valid for an actual receiving site by the data determined in the step of determining and of selecting, with the at least one second local list and using the unique program identifies, from the at least one first list the data blocks relating to all radio signals receivable at the actual receiving site.

13. The method of claim 1, in which the at least one first list includes numbers as unique program identifiers associated with the different data blocks wherein the at least one second local list also includes the numbers as the unique program identifiers.

14. The method of claim 13, wherein the data blocks and the associated numbers of at least one first list are transmitted by the at least one transmitter.

15. The method of claim 13, wherein the data blocks and the associated numbers of the at least one first list are stored in a receiver.

16. The method of claim 1, wherein the data in the at least one second local list of readio signals receivable as a functions of the actual receiving site are transmitted by the at least one transmitter as sequences of numbers.

17. The method of claim 1, wherein the data in the at least one second local list of radio signals receivable as a function of the actual receiving site are stored in a receiver.

18. The method of claim 1, wherein the data blocks in the at least one first list, include frequency bands, channels and frequency blocks in addition to at least one of a currently received frequency band, channel and frequency block.

19. The method of claim 1, in which the step of determining data on the actual receiving site comprises the step of at least approximately determining the actual receiving site by one of utilizing identification signals relating to the transmitter site transmitted by the at least one transmitter and a phase comparison hyperbolic position fixing process.

20. The method of claim 1, further comprising the step of determining data relatying to the actual receiving site by a satellite navigation system.

21. The method of claim 1, wherein the same radio signals are receivable at each site within a partial are associated with the at least one second local list and pertaining to a receiving area covered by the at least one transmitter.

22. The method of claim 1, wherein for an actual receiving site in a partial area transmitters transmit the data relating to radio signals receivable in the partial area and an adjacent area.

23. The method of claim 1, wherein for an actual receiving site in a partial area the data relating to radio signals receivable in the partial area and an adjacent area are stored in a storage of a receiver at the actual receiving site.

24. The method of claim 23, wherein during change from a receiving site to a further receiving site in an adjacent partial area data relating to receivable radio signals in the adjacent partial area are stored and data relating to radio signals in partial areas no longer adjacent to the further receiving site are removed from the storage.

25. The method of claim 24, further comprising the step of utilizing data relating to directional movement prior to arrival at the further receiving site for accelerating the exchange of data in the storage.

26. The method of claim 1, wherein the radio signals in the radio system comprise at least one of receivable program signals, types of programs and transmitters.

27. The method of claim 1, wherein the data blocks in the at least one first list are compiled in a single first list.

28. An apparatus for determining and providing radio signals and data relating to radio signals receivable at an actual receiving site by the utilization of local data in a radio system, comprising:
  means for determining data relating to radio signals in principle receivable in a receiving area covered by at least one transmitter, the data including at least one first list containing different data blocks relating to different radio signals receivable in principle in a given receiving area, each different data block having associated therewith a unique program identifier;
  means for selectively switching between an automatic and a manual determination of data relating to the actual receiving site;
  a storage means for storing at least one second local list for the selection of all radio signals receivable at the actual receiving site, the at least one second list containing for a given partial area of the receiving area including the actual receiving site, the unique program identifiers associated with the different data blocks relating to the radio signals actually receivable in the partial area, the data blocks being included in the first list only;
  control means for selecting from the at least one first list on the basis of the unique program identifiers included in the at least one second list associated with the local data valid data blocks from the at least one first list, which relate to radio signals receivable at an actual receiving site; and
  means for indicating the data blocks from the at least one first list valid for the actual receiving site.

29. The apparatus of claim 28, wherein the storage is a random access memory (RAM).

30. The apparatus of claim 28, further comprising one of an antenna and a further storage for receiving and storing the data blocks in the at least one first list.

31. The apparatus of claim 28, wherein the means for indicating is manually controllable and comprises at least one of a video and audio display.

32. An apparatus for determining and providing radio signals and data relating to radio signals receivable at an actual receiving site, comprising:
  means for determining data relating to the actual receiving site in a radio system, wherein receiving sites in a given receiving area are covered by at least one transmitter;
  means for utilizing, for determining data relating to radio signals receivable at the actual receiving site, at least one first list containing different data blocks relating to different radio signals receivable in principle in the given receiving area, each different data block having associated therewith a unique program identifier;
  means for utilizing, based on the data relating to the actual receiving site, at least one second local list for the selection of all radio signals receivable at the actual receiving site, the at least one second local list containing for a given partial area of the receiving area including the actual receiving site, the unique program identifiers associated with the different data blocks relating to the radio signals actually receivable in the partial area, the data blocks being included in the first list only; and
  means for directly directly providing on the basis of the data blocks included in the first list which are associated with the unique program identifiers included in the second local list, a radio signal selected from all the radio signals actually receivable at the actual receiving site.

33. A method of determining and providing radio signals and data relating to radio signals receivable at an actual receiving site by the utilization of local data in a radio system, comprising the steps of:
  determining data relating to radio signals in principle receivable in a receiving area covered by at least one transmitter, the data including at least one first list containing different data blocks relating to different radio signals in principle receivable in a given receiving area, each different data block having associated therewith a unique program identifier;
  selectively switching between an automatic and a manual determination of data relating to the actual receiving site;
  storing at least one second local list for the selection of all radio signals receivable at the actual receiving site, the at least one second list containing for a given partial area of the receiving area including the actual receiving site, the unique program identifiers associated with the different data blocks relating to the radio signals actually receivable in the partial area, the data blocks being included in the first list only;
  selecting from the at least one first list on the basis of the unique program identifiers included in the at least one second list associated with the local data valid data blocks from the at least one first block, which relate to radio signals receivable at the actual receiving site; and
  indicating the data blocks from the at least one first list valid for the actual receiving area.

34. The method of claim 28, in which the radio signals are digital radio signals.

* * * * *